(12) United States Patent
Naffziger

(10) Patent No.: US 6,621,310 B1
(45) Date of Patent: Sep. 16, 2003

(54) REDUCING POWER CONSUMPTION VARIABILITY OF PRECHARGE-PULLDOWN BUSSES

(75) Inventor: Samuel D. Naffziger, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/696,105

(22) Filed: Oct. 24, 2000

(51) Int. Cl.$^7$ .............................. H03B 1/00; H03K 3/00
(52) U.S. Cl. ............................... 327/112; 326/83
(58) Field of Search ............................ 327/112; 326/83, 326/86, 87, 95, 172–175

(56) References Cited

U.S. PATENT DOCUMENTS

| | | | |
|---|---|---|---|
| 5,128,555 A | * 7/1992 | Millman | 326/88 |
| 5,321,661 A | * 6/1994 | Iwakiri et al. | 365/222 |
| 5,650,971 A | * 7/1997 | Longway et al. | |
| 5,708,625 A | * 1/1998 | Sato et al. | 365/233.5 |
| 5,903,506 A | * 5/1999 | Blodgett | 365/222 |
| 6,087,872 A | * 7/2000 | Partovi et al. | 327/201 |

OTHER PUBLICATIONS

Interface Logic Control for a Fully Associate Table, IBM Technical Disclosure Bulletin, Oct. 1989, vol. 32, Issue No. 5B, pp. 415–417.*

* cited by examiner

*Primary Examiner*—Terry D. Cunningham
*Assistant Examiner*—Quan Tra
(74) *Attorney, Agent, or Firm*—Alexander J. Neudeck

(57) ABSTRACT

Current pulse matchers monitor the wires of a static or precharge-pulldown bus. Each current pulse matcher monitors the wire that it is connected to. For a precharge-pulldown bus, if the wire has been discharged during the pulldown cycle of the bus, the precharge current pulse matcher does not consume any current. If, however, the wire was not discharged during the pulldown cycle of the bus, then the precharge current pulse matcher consumes an amount of current that approximates the amount of current used to precharge that wire had it been discharged. For a static bus, the current pulse matcher does not shunt current if the wire has not just made a transition. Otherwise, the static bus current pulse matcher shunts an amount of current that may approximates the amount of current used to transition the bus signal from one logic state to another.

10 Claims, 3 Drawing Sheets

REDUCING POWER CONSUMPTION VARIABILITY OF PRECHARGE-PULLDOWN BUSSES

CROSS REFERENCE TO RELATED APPLICATIONS

A related copending United States patent applications commonly owned by the assignee of the present document and incorporated by reference in their entirety into this document is being filed in the United States Patent and Trademark Office on or about the filing date of this application. This application is Hewlett-Packard Company Ser. No. 09/696,383, and is titled "REDUCING POWER CONSUMPTION VARIABILITY OF STATIC BUSSES."

FIELD OF THE INVENTION

The present invention relates generally to integrated circuits, and more particularly, to techniques and circuits for reducing power supply droop and ground bounce oscillations.

BACKGROUND OF THE INVENTION

One of the causes of reduced on-chip power supply is a result of changes in the amount of current drawn from (or dumped to) the on-chip power supply lines. The changes in the amount of current drawn excite oscillations in the inherent inductances in the power delivery lines. These inherent inductances come mainly from the package leads and bond wires. The frequency of these oscillations depends upon a number of factors that vary from package-to-package and chip-to-chip. However, in high-performance integrated circuits, the frequency of operation may be much greater than the frequency of the oscillations on the power supplies. Accordingly, it is important that the circuits on these chips be designed to operate at the smallest voltage differential between a peak in the ground oscillation and a dip in the positive supply oscillation.

If circuits are not designed to operate at the smallest voltage differential between a peak in the ground oscillation and a dip in the positive supply oscillation, transistors may not meet their switch times and the operating frequency must be lowered. Thus, to meet frequency goals, the normal power supply voltage is increased to obtain a minimum acceptable differential between ground peaks and power supply dips. This increased operating voltage increases the integrated circuit's power dissipation. Increased power dissipation can increase the cost of several components of a system including the integrated circuit packaging, heat sink, and the system power supply. Furthermore, increasing the operating voltage tends to decrease the operating lifetime of the part thereby increasing the cost of a systems maintenance and amortized cost.

Accordingly, there is a need in the art for an apparatus and method for reducing the changes in the amount of current drawn on an integrated circuit's powers supplies.

SUMMARY OF THE INVENTION

An embodiment of the invention reduces the changes, or variability, in the amount of current drawn from, or dumped to, the power supplies of an integrated circuit. This, in turn, reduces the magnitudes of the smallest voltage differential between a peak in the ground oscillation and a dip in the positive supply oscillation. It is well adapted for fabrication on integrated circuits and can be particularly effective when used on wide, parallel, precharge-pulldown busses.

Instances of an embodiment of the invention are connected to the wires of a precharge-pulldown bus. Each instance monitors the wire that it is connected to. If the wire has been discharged during the pulldown cycle of the bus, the invention does not consume any current. If, however, the wire was not discharged during the pulldown cycle of the bus, then the invention consumes an amount of current that approximates the amount of current used to precharge that wire had it been discharged. This makes the power consumption to precharge precharge-pulldown busses less data dependent. Making the power consumption less data dependant reduces the overall variability in power consumption and that reduces the magnitude of the smallest voltage differential between a peak in the ground oscillation and a dip in the positive supply oscillation.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
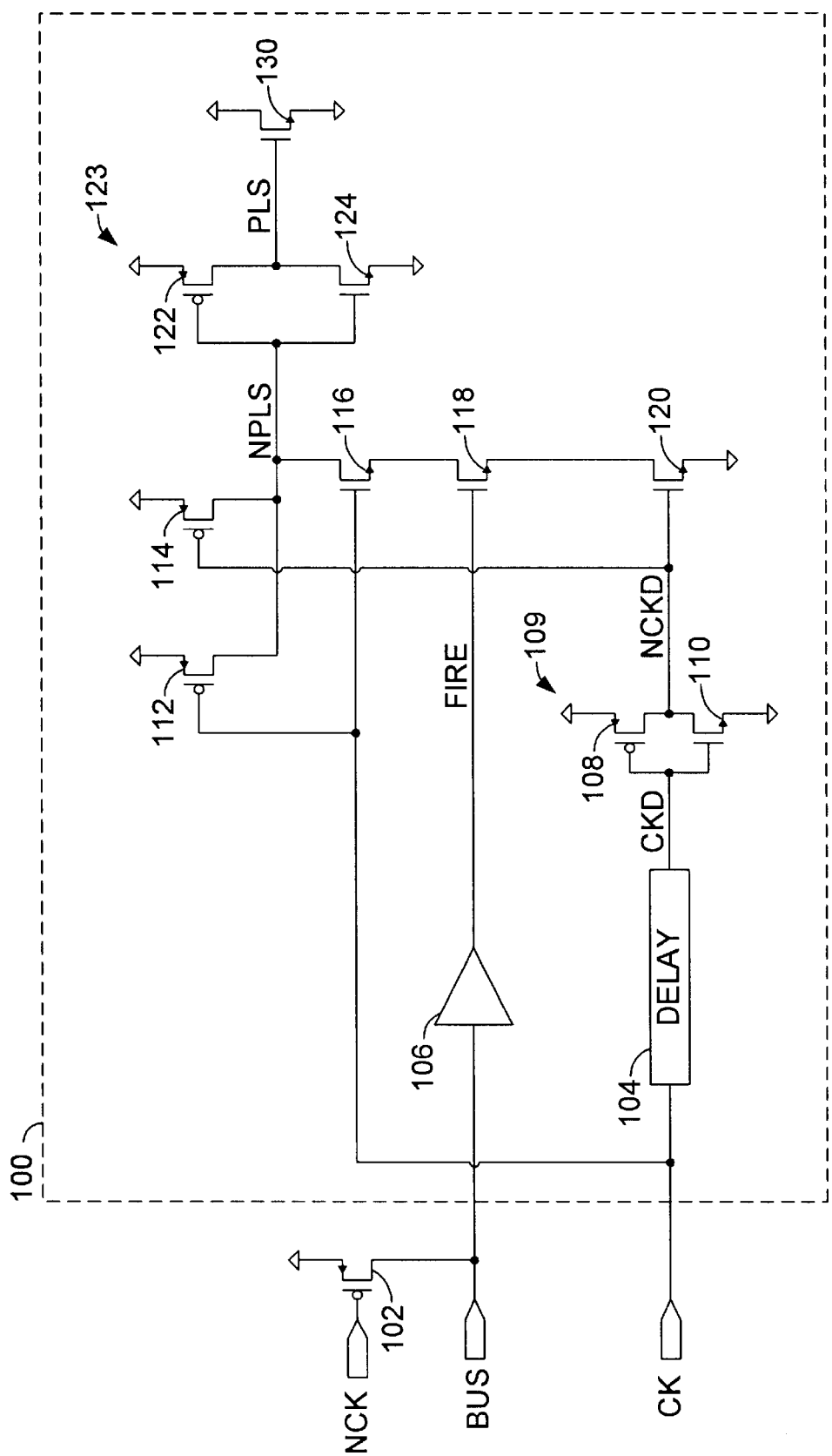
FIG. 1 is a schematic illustration of a precharge current pulse matcher and precharge transistor.

FIG. 1 is a schematic illustration of a precharge current pulse matcher 100 and precharge transistor 102. P-channel field effect transistor (PFET) 102 represents one or more transistors that precharge the bus line, BUS. CK and NCK are clock signals that control at least the precharge-pulldown sequencing of BUS and are complementary versions of each other.

In FIG. 1, the source of precharge transistor 102 is connected to the positive supply voltage. The drain of precharge transistor 102 is connected to the bus line, BUS. The gate of precharge transistor 102 is connected to NCK. CK is connected to the input of a delay element 104 that produces a delayed version of CK, CKD. Delay element 104 may be constructed a variety of ways known to those skilled in the art and includes a series of inverters. CK is also connected to the gate of N-channel field effect transistor (NFET) 116 and the gate of PFET 112. CKD is connected to the input of inverter 109 which is formed with PFET 108 and NFET 110. The output of inverter 109 is connected to NCKD. NCKD is also connected to the gate of PFET 114 and the gate of NFET 120. The bus line, BUS, is buffered by buffer 106 to produce the signal FIRE. FIRE is also connected to the gate of NFET 118.

PFETs 112 and 114 have their sources connected to the positive supply voltage and their drains connected the NPLS. Accordingly, when either CK or NCKD are low, either PFET 112 or 114 will pull NPLS high, respectively. The drain of NFET 116 is also connected to NPLS. The source of NFET 116 is connected to the drain of NFET 118. The source of NFET 118 is connected to the drain of NFET 120. The source of NFET 120 is connected to the negative supply voltage.

Since NFETs 116, 118, and 120 are connected in series between NPLS and the negative supply rail, it is only when CK, FIRE, and NCKD are all high that NPLS is pulled low. Also note that since FIRE is a buffered version of the bus line, BUS, NPLS will only be pulled low when the bus line is high—a situation wherein the precharge transistor would not be precharging BUS because it would already be in a high, or precharged, state. Also note that NPLS will be pulled low only for a little more time than the delay of delay element 104 because that is the amount of time that CK and NCKD are both high before the rising of CK propagates through delay element 104 and inverter 109 causing NCKD to go low pulling up NPLS.

NPLS is connected to the input of inverter 123 that is formed with PFET 122 and NFET 124. The output of inverter 123 is signal PLS. PLS is also connected to the gate of shunt transistor 130. Shunt transistor 130 is an NFET and has its drain connected to the positive supply rail and its source connected to the negative supply rail so that it shunts current from the positive supply rail to the negative supply rail when it is on. Shunt transistor 130 is on when PLS is high and PLS is high when NPLS is low. Therefore, shunt transistor 130 is only on for a little more time than the delay of delay element 104 because that is the amount of time NPLS can be low.

Accordingly, if the delay of delay element 104 is picked properly, the current shunted by 130 when BUS is high and CK switches from a low to a high can be made to approximate the current required to charge BUS when bus is low and CK switches from a low to a high. Simulation with a circuit simulator or calculation by other numerical methods may be used to choose the delay of delay element 104 so that the current shunted by 130 when BUS is high and CK switches from a low to a high can be made to approximate the current required to charge BUS when bus is low and CK switches from a low to a high.

Since the two currents consumed when BUS is low and when BUS is high approximate each other, the variability in current consumption resulting from the state of BUS is reduced. Therefore, the overall variability in current (or power) consumption for the integrated circuit is reduced. This reduction is made more dramatic by placing precharge current pulse matchers 100 on all the lines on many of the precharge-pulldown busses that require the most current to precharge. This larger, more dramatic reduction in variability can significantly reduce the magnitude of the smallest voltage differential between a peak in the ground oscillation and a dip in the positive supply oscillation.

Figure 2:
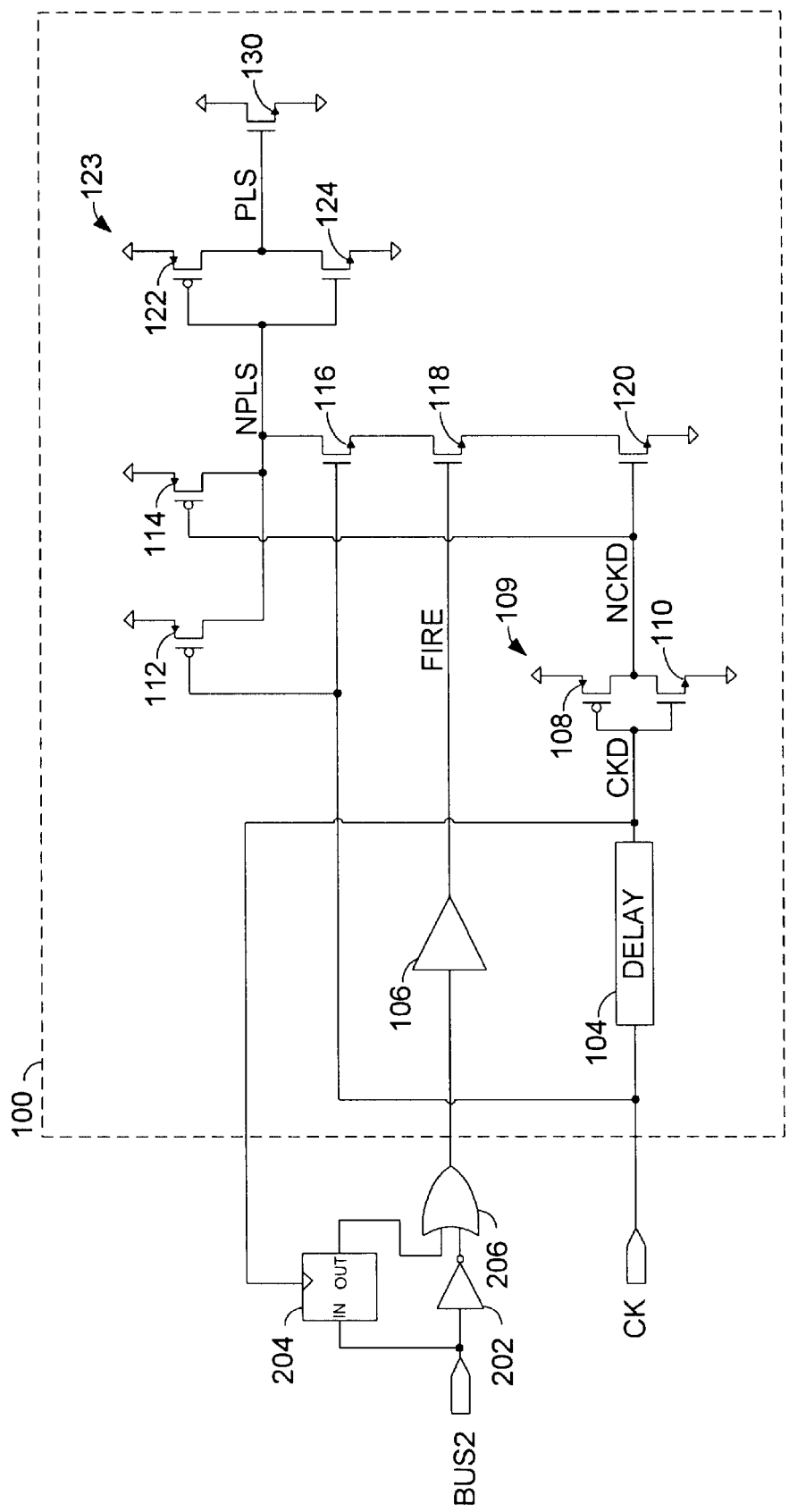
FIG. 2 is a schematic illustration of how the precharge current pulse matcher of FIG. 1 may be used as a static bus current pulse matcher.

FIG. 2 is a schematic illustration of how the precharge current pulse matcher 100 of FIG. 1 may be used as a static bus current pulse matcher. In FIG. 2, BUS2 is a static bus line that changes on the falling edge of clock CK. BUS2 is connected to the input of an edge-triggered latch 204 and an inverter 202. The output of inverter 202 is connected to an OR gate 206. The other input to OR gate 206 is connected to the output of edge-triggered latch 204. Edge triggered latch 204 is clocked by the delayed version of CK, CKD. The output of OR gate 206 is connected to the input of buffer 106. Accordingly, the input circuit 202, 204, 206 instructs precharge current pulse matcher 100 to shunt current whenever the previous state of the bus is not a low and the current state of the bus is not a high. In other words, the input circuit 202, 204, 206 instructs the precharge current pulse matcher to shunt current whenever a low-to-high transition has not just occurred on BUS2. This has the effect of increasing overall power consumption of a static bus, but reduces the variability in that power consumption for that static bus.

Figure 3:
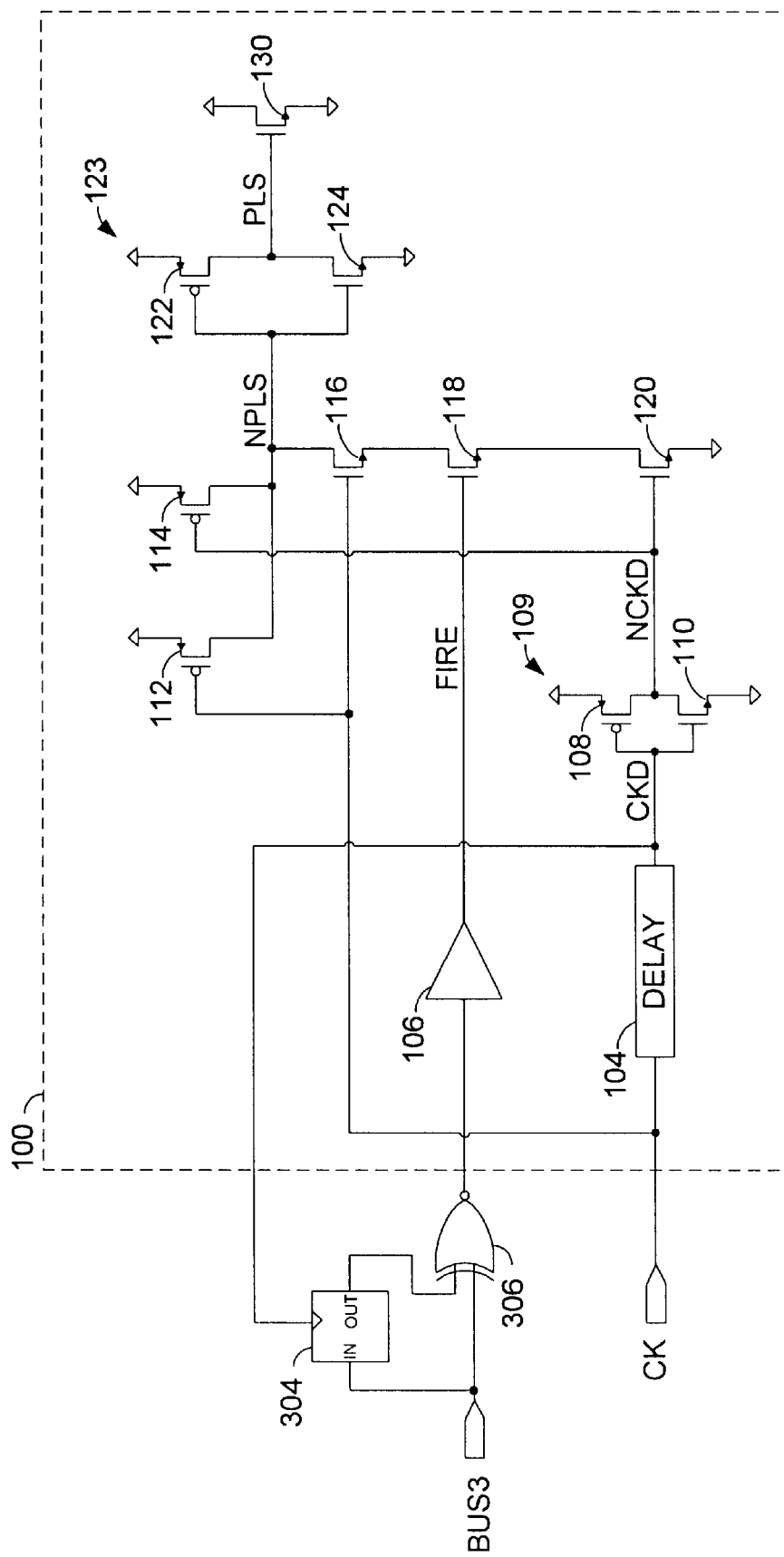
FIG. 3 is a schematic illustration of another embodiment of how the precharge current pulse matcher of FIG. 1 may be used as a static bus current pulse matcher.

Also, one of ordinary skill in the art would recognize that the circuit of FIG. 2 could readily be modified to shunt under a variety of conditions relating to the previous states of the bus that would also reduce the variability in power consumption for a static bus. FIG. 3 illustrates one such example.

FIG. 3 is a schematic illustration of another embodiment of how the precharge current pulse matcher 100 of FIG. 1 may be used as a static bus current pulse matcher. In FIG. 3, BUS3 is a static bus line that changes on the falling edge of clock CK. BUS3 is connected to the input of an edge-triggered latch 304 and an XNOR (or equality gate) 306. The other input to XNOR gate 306 is connected to the output of edge-triggered latch 304. Edge triggered latch 304 is clocked by the delayed version of CK, CKD. The output of XNOR gate 306 is connected to the input of buffer 106. Accordingly, the input circuit 304, 306 instructs precharge current pulse matcher 100 to shunt current whenever the state of the bus does not change from one cycle to the next. The amount of current shunted is set to approximate one-half of the current consumed by a low-to-high transition. This has the effect reducing the variability in the power consumption for that static bus without consuming as much power as the embodiment shown in FIG. 2. Also, one of ordinary skill in the art would recognize that the circuit of FIG. 3 could readily be modified to shunt under a variety of conditions relating to the previous states of the bus that would also reduce the variability in power consumption for a static bus.

Although a specific embodiment of the invention has been described and illustrated, the invention is not to be limited to the specific forms or arrangements of parts so described and illustrated. The invention is limited only by the claims.

What is claimed is:

1. An integrated circuit, comprising:
   a first power supply; and,
   a precharge-pulldown bus line coupled to a shunt with a control circuit that causes said shunt to draw current from said first power supply via a path that does not include said precharge-pulldown bus line when said precharge-pulldown bus line does not need to be precharged and wherein said current is a first current and said first current approximates a second current wherein said second current is an amount of current drawn from said first power supply to precharge said precharge-pulldown bus line when said precharge-pulldown bus line precharges from an unprecharged state and wherein said shunt draws said current during a precharge phase of said precharge-pulldown bus line.

2. The integrated circuit of claim 1 wherein said first current approximates said second current in timing and magnitude.

3. The integrated circuit of claim 2 further comprising:
   a delay element that controls the duration of said first current.

4. A method of reducing the variability in current drawn from a power supply, comprising:
   drawing a first current from a first power supply via a path that does not include a first precharge-pulldown bus line wherein said first current approximates a second current-wherein said second current is an amount of current drawn from said first power supply to precharge said precharge-pulldown bus line when said first precharge-pulldown bus line precharges from an unprecharged state.

5. The method of claim 4 further comprising:
   drawing said second current but not said first current when said first precharge-pulldown bus line needs precharging.

6. The method of claim 4 wherein said first current approximates said second current in timing and magnitude.

7. The method of claim 6 wherein said first current is controlled by a delay element.

8. An integrated circuit, comprising:

a precharge-pulldown bus line;

a shunt that draws current from a first power supply via a path that does not include said precharge-pulldown bus line;

a shunt control circuit that turns on said shunt during a precharge cycle of said precharge-pulldown bus line when said precharge-pulldown bus line is already precharged thereby drawing a first amount of charge from said first power supply that approximates a second amount of charge drawn from said first power supply to precharge said precharge-pulldown bus line when said precharge-pulldown bus line precharges from an unprecharged state and wherein a delay element has an input and said input is a complement of a clock used to control the precharge-pulldown cycling of said precharge-pulldown bus line and wherein said shunt control circuit uses pulses to turn said shunt on and off and a duration of said pulses is determined primarily by said delay element.

9. A precharge current pulse matcher, comprising:

an input;

a current shunt that draws current from a power supply via a path that does not include a first precharge-pulldown bus line when said shunt is on; and, a pulse generator that controls said current shunt and wherein said pulse generator only turns said shunt on for a reasonably fixed duration when said input indicates that said first precharge-pulldown bus line is already precharged thereby drawing a first amount of charge from said power supply through said current shunt that approximates a second amount of charge drawn from said power supply to precharge said precharge-pulldown bus line when said first precharge-pulldown bus line precharges from an unprecharged state.

10. The precharge current pulse matcher of claim 9, wherein said pulse generator includes a delay element that sets said reasonably fixed duration.

\* \* \* \* \*

UNITED STATES PATENT AND TRADEMARK OFFICE
CERTIFICATE OF CORRECTION

PATENT NO.   : 6,621,310 B1
DATED        : September 16, 2003
INVENTOR(S)  : Samuel D. Naffziger It is certified that error appears in the above-identified patent and that said Letters Patent is hereby corrected as shown below:

Title page,
Item [75], Inventor, please add -- Wayne D. Kever --

Signed and Sealed this

Twenty-second Day of March, 2005

JON W. DUDAS
*Director of the United States Patent and Trademark Office*